US006275095B1

(12) United States Patent
Hoshino et al.

(10) Patent No.: US 6,275,095 B1
(45) Date of Patent: Aug. 14, 2001

(54) SEMICONDUCTOR AMPLIFIER CIRCUIT

(75) Inventors: Taichi Hoshino; Kengo Adachi; Eitaro Oyama, all of Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/433,050

(22) Filed: Nov. 3, 1999

(30) Foreign Application Priority Data

Nov. 4, 1998 (JP) .................................................. 10-313435

(51) Int. Cl.[7] ...................................................... H03K 3/01
(52) U.S. Cl. ............................................ 327/534; 327/560
(58) Field of Search ..................................... 327/432, 433, 327/437, 478, 539, 534, 535, 537, 560, 562; 257/370, 378, 517, 526

(56) References Cited

U.S. PATENT DOCUMENTS

| | | | |
|---|---|---|---|
| 5,886,387 | * 3/1999 | Nishigohri et al. | 257/370 |
| 5,939,936 | * 8/1999 | Beiley et al. | 327/537 |
| 5,998,843 | * 12/1999 | Yoshida | 257/370 |
| 6,043,541 | * 3/2000 | Violette et al. | 257/370 |

* cited by examiner

*Primary Examiner*—My-Trang Nu Ton
(74) *Attorney, Agent, or Firm*—Mattingly, Stanger & Malur, P.C.

(57) ABSTRACT

A semiconductor amplifier circuit comprises a semiconductor substrate of one conductivity type, a well region of the one conductivity type, formed in said semiconductor substrate, a well region defining region of the other conductivity type, including a side wall portion and a bottom portion defining the well region, a first transistor formed in the well region and a second transistor formed on a surface of another portion of the substrate other than a portion on which the well region is formed. When the first and second transistors are in operation, a potential of the substrate is set to a reference potential, a potential of the well region defining region is set equal to the potential of the substrate or set to a value at which a junction between the well region defining region and the substrate is reverse-biased and at least one of the electrodes of the first transistor is set to a potential at which a junction between the well region defining region and the well region is reverse-biased.

7 Claims, 3 Drawing Sheets

SEMICONDUCTOR AMPLIFIER CIRCUIT

BACKGROUND OF THE INVENTION

1. Technical Field

The present invention relates to a semiconductor amplifier circuit and, particularly, to a semiconductor amplifier circuit such as an operational amplifier circuit driven by a positive and negative power source or a push-pull driven amplifier circuit having an output potential intermediate between a ground potential and a potential of a power source line, which is hardly influenced by noise such as power source ripple.

2. Description of the Related Art

A semiconductor amplifier circuit of audio equipment or a semiconductor amplifier circuit utilizing an operational amplifier has been driven by a single power source, that is, a positive or negative power source or driven by two power sources, that is, both a positive power source and a negative power source. In the single power source case, it is usual to connect a semiconductor substrate of the semiconductor amplifier circuit to a ground potential or a potential of a power source line as a reference potential. In the two-power source case, the amplifier circuit is designed by selecting a potential of a positive side power source line or a potential of a negative side of the power source line, which is the lowest, as a potential reference.

As shown in FIG. 4(a), a transistor constituting a semiconductor amplifier circuit of this type, that is, a driving transistor 20 is formed by providing, for example, a $P^+$ isolation in a P type substrate 21. This amplifier circuit is constituted as a transistor circuit 22 equivalent thereto as shown in FIG. 4(b). An input signal is input to an input terminal IN and an output signal is output at an output terminal OUT. In such circuit, parasitic diodes Dk are formed simultaneously in a reverse direction between an emitter and a base or between the emitter and a collector through the P type substrate 21 and, further, a parasitic capacitance Ck is formed.

The parasitic elements such as diodes or parasitic capacitor are necessarily formed due to the structure of the IC and, when a voltage lower than the reference potential set in the input terminal IN is applied thereto, the parasitic diodes Dk are turned ON, so that there is a problem that currents may flow from the substrate side to the respective transistor forming layers. In order to solve such problem, it is usual to not apply a voltage lower than the substrate potential (reference potential) to the input terminal IN. in order to realize the latter, the potential reference mentioned above must be employed.

FIG. 5 shows a circuit diagram of a semiconductor amplifier circuit operable with a positive and negative power sources.

In FIG. 5, an amplifier circuit 8 formed in a semiconductor integrated circuit is constructed with an amplifier circuit 1 and constant current sources 2 and 3 connected to a negative power source line −Vcc. The amplifier circuit 1 has an input terminal 8a and an output terminal 8b. A differential amplifier circuit 4 is provided as an input stage and an output amplifier 5 is provided as an output stage. An input signal Vin is supplied from a preceding stage to the input terminal 8a.

The differential amplifier circuit 4 includes npn type differential transistors Q1 and Q2 having emitters commonly connected to the constant current source 2 through which the emitters are connected to the negative side power source line −Vcc. Further, pnp transistors Q3 and Q4 which constitute a current mirror circuit are connected to collectors of the respective npn type differential transistors Q1 and Q2 as loads thereof. The collectors of the transistors Q3 and Q4 are connected to the positive side power source +Vcc.

The constant current source 2 is constituted with npn type transistors Q5 and Q6 which constitute a current mirror circuit. The diode-connected, input side transistor Q6 is supplied with a constant current from a constant current source 7 and the output transistor Q5 of the current mirror circuit sinks a constant current from the common emitters of the differential transistors Q1 and Q2.

A base of the differential transistor Q1 is connected through a resistor Rs to the input terminal 8a and a base of the differential transistor Q2 is grounded.

The output amplifier 5 is constituted with a pnp type transistor Q7 having an emitter connected to the power source line +Vcc, a collector connected to the output terminal 8b and through the constant current source 3 to the negative power source line −Vcc and a base connected to the collector of the differential transistor Q1.

An output voltage at the output terminal 8b is applied through a feedback resistor Rf to the base of the differential transistor Q1.

Since the constant current source 3 is constructed similarly to the constant current source 2, details thereof is omitted.

In the circuit shown in FIG. 5, a reference potential at the substrate is usually set to the negative side power source potential −Vcc. In such circuit, the ground potential which is an intermediate potential between the positive and negative power source potentials is not used as the reference potential for the reason mentioned previously. Therefore, an output signal Vo obtained at the output terminal 8b tends to be influenced by a potential variation of the substrate.

Particularly, in an integrated circuit, a number of circuits are operated by a power source. Therefore, ripple of its power source voltage is unavoidable. Since the substrate side potential, that is, the negative side power source potential −Vcc and the positive side power source potential +Vcc are relative, the substrate side potential is varied by the ripple voltage when looked from the positive side power source potential +Vcc. When the potential of the substrate is varied with the ripple, signals tend to enter through the parasitic capacitance Ck into respective circuits of the integrated circuit and appear as noise signals. Further, in the worst case, the parasitic diodes Dk are turned ON, causing the integrated circuit to be operated erroneously.

The problem of such power source ripple becomes severe when a plurality of amplifier circuits driven by both the positive and negative power sources are integrated as a single semiconductor, because the power source ripple is increased due to increased difference in potential between the positive power source and the negative power source and the negative side power obtained by driving the internal circuit generating the negative power source voltage with a power from the positive power source circuit.

SUMMARY OF THE INVENTION

An object of the present invention is to provide a semiconductor amplifier circuit which is hardly influenced by noise such as power source ripple when it is driven by one or both of a positive power source and a negative power source.

In order to achieve the above object, a semiconductor amplifier circuit according to the present invention comprises a semiconductor substrate of one of a P type and an N type, a well region of the same type as that of the substrate, formed in the substrate, a well region defining region of the other type, including a side wall portion and a bottom portion defining the well region, a first transistor formed in the well region and a second transistor formed on a surface of other portion of the substrate than a portion on which the well region is formed. During the first and second transistors are in operation, a potential of the substrate is set to a reference potential, a potential of the well region defining region is set equal to the potential of the substrate or set to a value with which a junction between the well region defining region and the substrate is reverse-biased and at least one of electrodes of the first transistor is set to a potential with which a junction between the well region defining region and the well region is reverse-biased.

In such amplifier circuit, the conductivity type of the well region defining region is opposite to that of the substrate and the potential thereof is set equal to a potential of the substrate when the latter is set to a reference potential or to a potential with which a junction between the well region defining region and the substrate is reverse-biased and at least one of electrodes of the first transistor is set to a potential with which a junction between the well region defining region and the well region is reverse-biased. With such situation, it is possible to make the well region and semiconductor elements formed therein in floating state with respect to the substrate and to operate the first transistor formed in the well region separately from the substrate.

As a result, it is possible to independently operate the first and second transistors by separate power sources. Therefore, it is possible to operate the second transistor by a first power source voltage with the substrate being at a reference potential and operate the first transistor by a second power source voltage lower than the first power source voltage.

In such case, ripple occurs in higher one of the first and second power source voltages when looked from the reference potential (substrate potential). Assuming that the first power source voltage is equal to the second power source voltage, the reference potential becomes substantially a half of the power source voltage. Therefore, the potential variation on the substrate side due to noise such as ripple is reduced correspondingly, so that it is possible to construct the amplifier circuit, which is hardly influenced thereby. In a case where the circuit is driven by two power sources, the reference potential becomes ground potential.

As a result, it is possible to provide an amplifier circuit, which is hardly influenced by noise such as power source ripple, regardless of power source, one power source or two power sources.

DETAILED DESCRIPTION OF THE PREFERRED EMBODIMENTS

Figure 1:
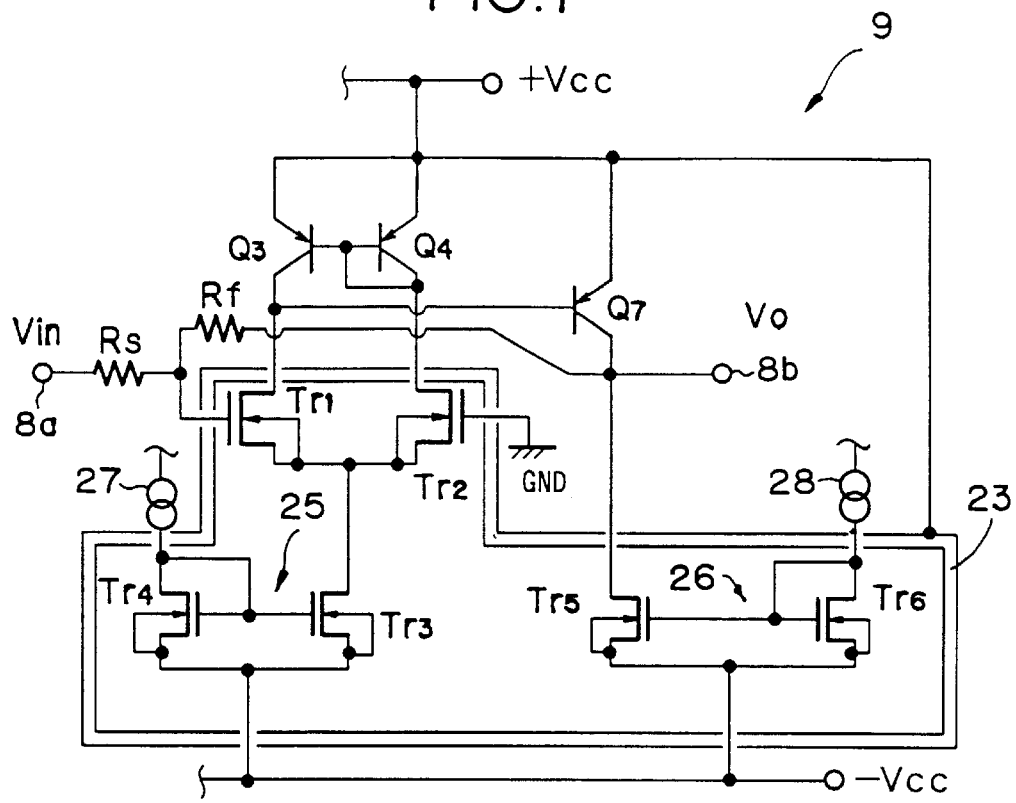
FIG. 1 is a circuit diagram of an amplifier circuit according to an embodiment of the present invention, which is driven by a positive and negative power sources and uses a ground potential as a reference potential.

In FIG. 1, a semiconductor amplifier circuit 9 according to an embodiment of the present invention has a well region (floating region) 23 in which N-MOS transistors Tr1 to Tr6 are formed in a floating state with respect to a substrate side. Bipolar transistors Q3 and Q4 and other elements formed outside the floating region 23 are the same as those shown in FIG. 5. Therefore, details thereof are omitted to avoid duplication of description.

Figure 5:
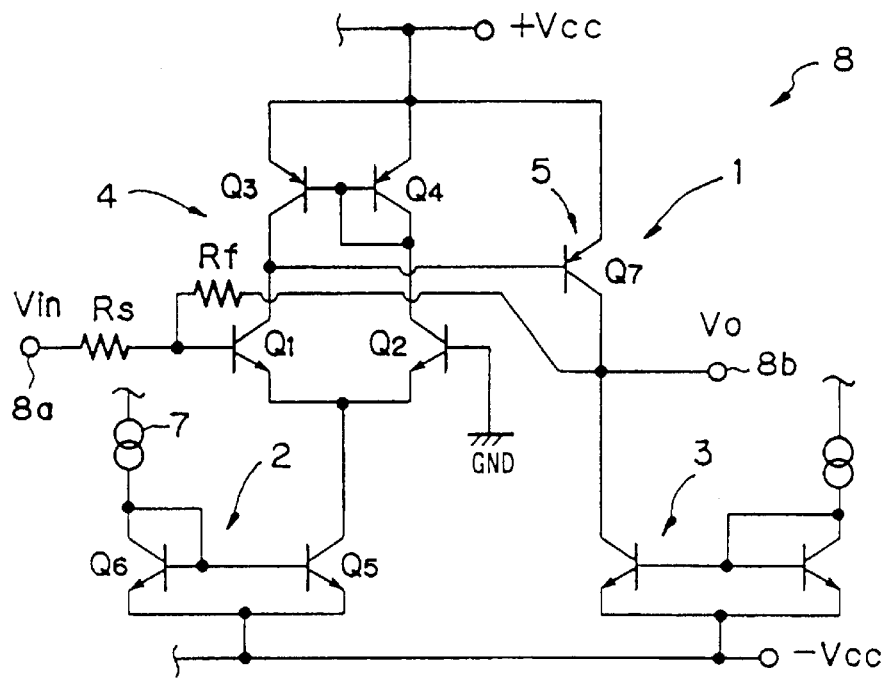
FIG. 5 is a circuit diagram of a conventional semiconductor circuit driven by positive and negative power sources.

Instead of the differential transistors Q1 and Q2 shown in FIG. 5, the N-MOS transistors Tr1 and Tr2 are provided in the floating region 23 shown in FIG. 1 and, further, a constant current source 25 constructed as a current mirror circuit with the N-MOS transistors Tr3 and Tr4 and a constant current source 26 constructed as a current mirror circuit with the N-MOS transistors Tr5 to Tr6 are provided in lieu of the respective constant current sources 2 and 3 shown in FIG. 5.

The input side N-MOS transistor Tr4 of the constant current source 25 is diode-connected and a drain side thereof receives a current from the constant current source 27. A drain of the output side transistor Tr3 is connected to common sources of the differential transistors Tr1 and Tr2 and sinks the constant current from the sources. Sources of the transistors Tr3 and Tr4 are connected commonly to a negative power source −Vcc.

The constant current source 26 has the same construction as that of the constant current source 25. That is, it takes in the form of a current mirror circuit composed of the N-MOS transistors Tr5 and Tr6. The input side transistor Tr6 is diode-connected and a drain side thereof receives a current from the constant current source 28. A drain of the output side transistor Tr5 is connected to a collector of the output transistor Q7 and sinks a constant current from the latter collector. Sources of the transistors Tr5 and Tr6 are commonly connected to the negative power source −Vcc.

As described, by setting any one of the source electrode (S), the drain electrode (D) and the gate electrode (G) to the ground potential or less and floating the transistors Tr1 and Tr2 operated by the negative power source potential and the transistors Tr3 to Tr6 connected to the negative side power source potential −Vcc from the substrate 11, it becomes possible to operate the N-MOS transistors Tr1 to Tr6 by a power source independent from the positive power source of the bipolar transistors Q3, Q4 and Q7. Therefore, it becomes possible to operate the amplifier circuit portion composed of the bipolar transistors Q3, Q4 and Q7 by the positive side power source with using the ground potential GND as the reference. Further, it becomes possible to operate the N-MOS transistors Tr1 to Tr6 by the negative side power source with using the ground potential as the reference, similarly.

Since the respective circuits operate with using the ground potential GND (potential of the substrate 11) as the reference potential as mentioned, the power source ripple becomes a half or less of the conventional case in which the positive side power source potential +Vcc or the negative side power source potential −Vcc is used as the reference potential.

Figure 2:
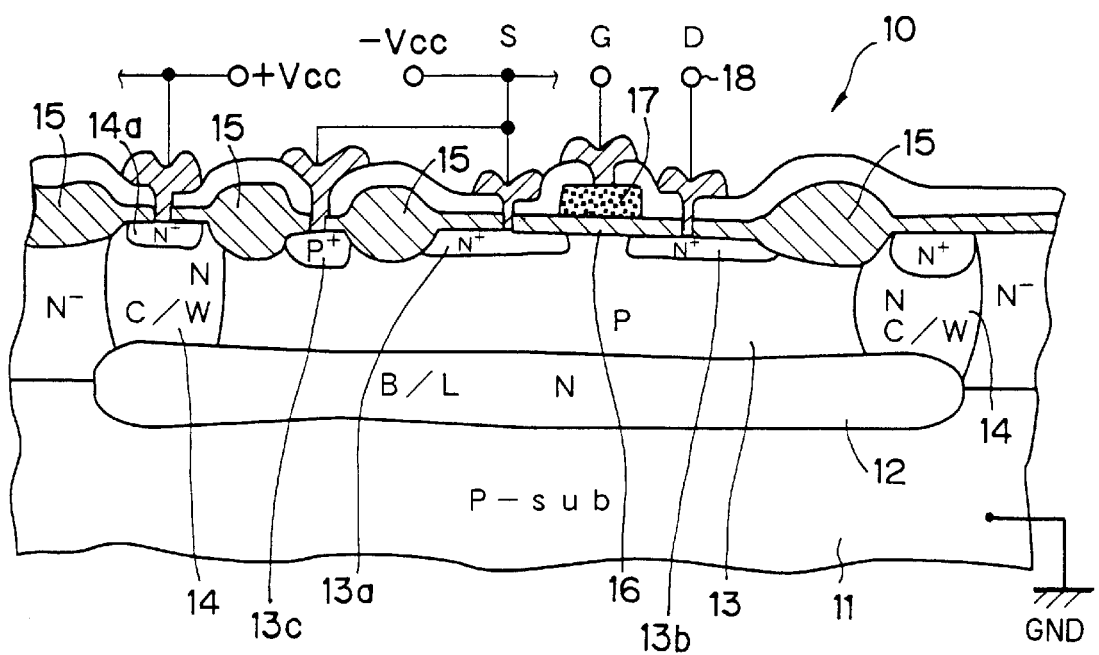
FIG. 2 is a cross sectional view of a region which is defined in a negative power sources side of the amplifier circuit and in which an N-MOS transistor is formed.

The N-MOS transistors Tr1 to Tr6 formed in the floating region 22 are transistors formed in the N-MOS transistor forming region 10 shown in FIG. 2.

FIG. 2 shows a structure of an N-MOS transistor amplifier circuit operable independently by a potential lower than the ground potential GND or the negative side power source potential, with using the ground potential GND as the reference potential.

An N-MOS transistor forming region 10 is formed by epitaxially growing an N type buried layer (B/L) 12 in the P type substrate 11, removing an oxide film formed on the N type buried layer, injecting P$^+$ type ions into the portion of the N type buried layer 12, epitaxially forming an N layer on the P type layer and N type layer for forming a P type well region 13 on the portion of the N type buried layer and forming an N type diffusion isolating region 14 surrounding the P type well region 13 by doping an inner edge portion of the N type region with N type impurity.

As a result, the P type well region 13 defined by the N type diffusion isolating region 14 surrounding the P type well region in plan view as a side wall and the N type buried layer 12 as a bottom wall is provided. Therefore, elements to be formed in the P type well region 13 become in an electrically floating state with respect to the P type substrate 11 by setting the potential of the N type portions surrounding the P type well region 13 equal to the potential of the substrate 11 or to a potential between the potentials of the substrate 11 and the P well region 13, since the P type well region 13 is isolated from the surrounding N type portions by a space charge layer formed in at least one of N-P junctions therebetween, which is reverse-biased during an operation.

Incidentally, a reference numeral 15 in FIG. 2 depicts an element isolating oxide film formed by local oxidation of silicon (LOCOS). As mentioned, the diffusion isolating region 14 is formed around the P type well region 13 correspondingly to the width of the N type buried layer 12 to form the side wall, that is, a collector wall (C/W) with respect to the P type well region 13.

In the P type well region 13, N$^+$ type source and drain regions 13a and 13b are formed on both sides of a channel forming region 16 in a surface portion thereof by diffusion.

A reference numeral 17 depicts a gate layer. The gate layer 17, the source region 13a and the drain region 13b are derived externally as a gate electrode G, a source electrode S and a drain electrode D through an aluminum wiring, respectively. Further, an N$^+$ type deriving region 14a is formed in an upper surface portion of the diffusion isolating region 14 by diffusion. The deriving region 14a is connected to a positive power source +Vcc through an aluminum wiring. Further, a P$^+$ type deriving region 13c is formed in the upper surface portion of the P type well region 13 by diffusion. The deriving region 13c is connected to the source electrode S through an aluminum wiring using the P type well region 13 as a back gate and the source electrode S is connected to a negative power source -Vcc.

It should be noted that, in FIG. 2, one of the transistors Tr3 to Tr5 constituting the constant current sources shown in FIG. 1 is formed in the NMOS transistor forming region 10. As shown in FIG. 2, the source electrode S is connected to the negative power source -Vcc and the drain electrode D constitutes the input terminal 18 which receives a current from an upstream side transistor. Further, the substrate 11 is grounded.

As mentioned, the P type well region 13 is defined by the N type diffusion isolating region 14 surrounding it as the side wall and the N type buried layer 12 forming the bottom. Therefore, with the previously mentioned potential setting for operation, in which the portion defining the P type well region 13 is set to the potential of the positive power source +Vcc and the substrate 11 is set to the ground potential, the N-P junction between the portion defining the P type well region 13 and the substrate 11 is reverse-biased, so that the space charge layer is formed therebetween. Further, the N-P junction between the portion defining the P type well region 13 and the P type well region 13 is also reverse-biased, so that the space charge layer is formed therebetween.

Therefore, the P type well region 13 is isolated from the substrate 11 and the element formed in the P type well region 13 or a portion of the P type well region 13 in which the element is formed becomes in the floating state with respect to the substrate 11. As a result, it becomes possible to operate the element by a power source provided separately, as shown in FIG. 1.

A voltage which is a double of the power source voltage is applied between the drain electrode D and the source electrode S of each of the transistors Tr1 to Tr6 formed in the N-MOS transistor forming region 10 shown in FIG. 2. That is, assuming that the power source voltage is 5V, +Vcc=+5 v and -Vcc=-5V. Therefore, the transistors Tr1 to Tr6 have to be operated by a total power source voltage of 10V which is twice the operating voltage of the usual transistor, so that transistors having such breakdown voltage are required as the transistors Tr1 to Tr6.

Depending upon the power source voltage to be used, the thickness of the P type well region 13 and the resistivity thereof become a problem. The usual power source voltage is 3V to 5V. When the amplifier circuit is operated with such usual power source voltage, it is possible to form transistors having the required breakdown voltage in the P type well region 13 even when the positive and the negative power sources are used, if the sheet resistance of the P type well region 13 whose practical thickness is usually in the order of several microns to 10 μm is 2 kΩ to 5 kΩ.

In a case where transistors having low breakdown voltage are to be formed in the P type well region 13, it is enough to set the potential of the N type diffusion isolating region 14 and the N type buried layer 12, which define the P type well region 13, to the ground potential or a potential slightly higher than the ground potential. When the N type diffusion isolating region 14 and the N type buried layer 12, which define the P type well region 13, is set to the ground potential which is the potential of the substrate 11, the N-P junction between them is forward-biased, resulting in a parasitic diode when looked from the side of the substrate 11. Since, however, there is the N type layer 12 when looked the P type well region 13 from the substrate 11, the junction between N type layer 12 and the substrate 11 becomes a reverse diode, so that the substrate 11 is substantially separated from the P type well region 13. Further, in such case, the reverse parasitic diode is inserted when the substrate 11 is looked from the N type diffusion isolating region 14 and the N type buried layer 12, and the portion defining the P type well region 13 and the P type substrate 11 are set to the ground potential. Therefore, there is no current flowing between them.

Figure 3:
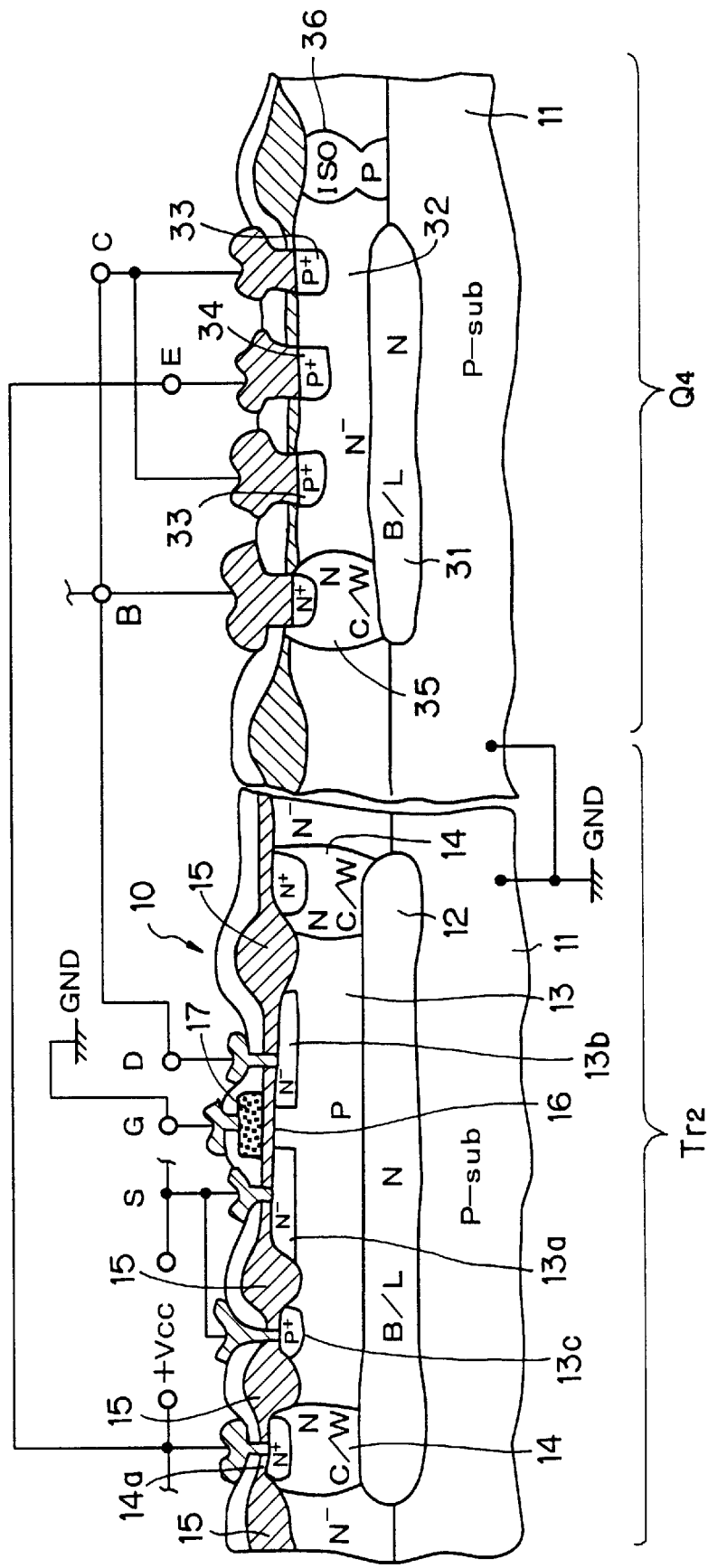
FIG. 3 is a cross sectional view illustrating a connection between a bipolar transistor and the N-MOS transistor.

FIG. 3 shows a connecting relation of the bipolar transistor Q4 and the N-MOS transistor Tr2, which are adjacent on the surface of the substrate 11. The bipolar transistor Q4 is formed on a surface of other portion than the P type well region 13 similarly to the bipolar transistor Q3. The bipolar transistor Q4 has a usual structure of a lateral pnp transistor similar to, but not the same as that shown in FIG. 4. That is, the bipolar transistor Q4 is constructed with an N$^-$ type well region 32 formed as a base region on an N type base buried layer 31, a collector wall 35 formed on one side of the base region, a P$^+$ collector region 33 and a P$^+$ emitter region 34 formed on an upper surface of the N$^-$ type well region 32 and electrode deriving regions formed on the surface portion of the collector wall 35 for deriving a collector electrode C, a base electrode B and an emitter electrode E. The transistor Q3 has a structure similar to this structure. Incidentally, a reference numeral 36 depicts an element isolating region (ISO).

Figure 4A:
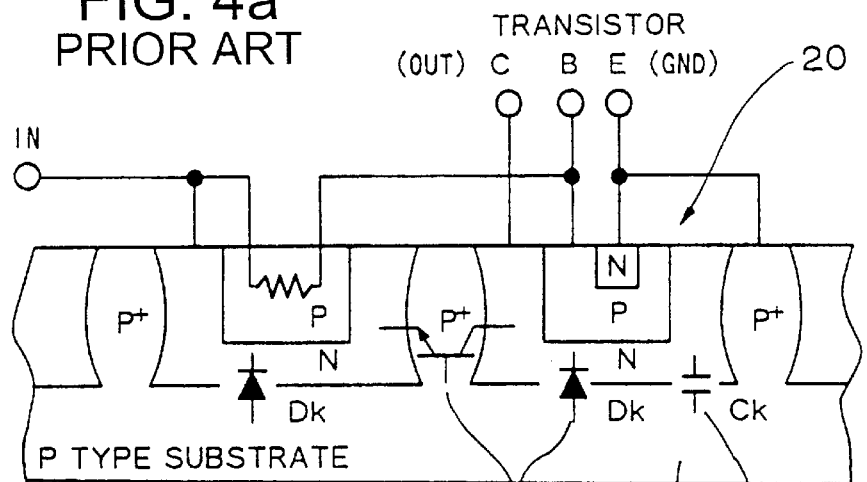
FIGS. 4(a) and 4(b) are a cross sectional view of a driving transistor element of a conventional semiconductor device and an equivalent circuit thereof, respectively.
Figure 4B:
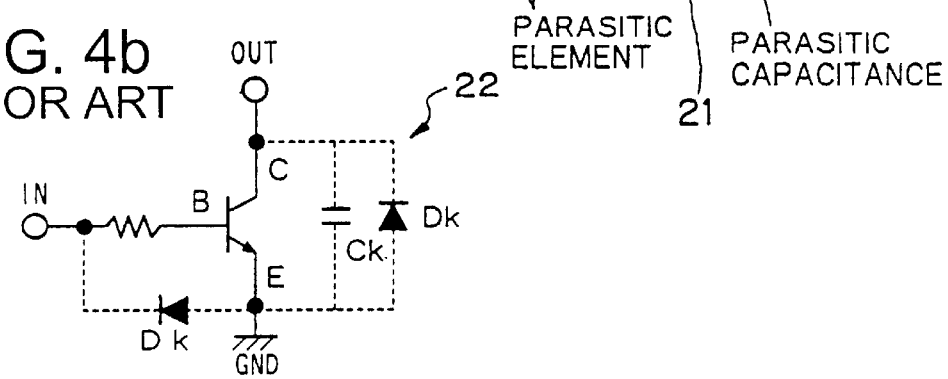

The N-MOS transistor Tr2 shown in FIG. 4 has the same structure as shown in FIG. 2 except a connecting wiring of a source electrode S, a gate electrode G and a drain electrode D. The source electrode S of the N-MOS transistor Tr2 shown in FIG. 3 is connected to the drain electrode D of the transistor Tr3 having the structure shown in FIG. 2. The base electrode B and the collector electrode C of the bipolar transistor Q4 are commonly connected to the drain electrode D of the transistor Tr2 shown in FIG. 3 and the emitter electrode E thereof is connected to the positive power source +Vcc.

On the other hand, the base electrode B of the bipolar transistor Q3 is connected to the base electrode B of the bipolar transistor Q4 shown in FIG. 3, the emitter electrode E is connected to the positive power source +Vcc and the collector electrode C is connected to the drain electrode D of the N-MOS transistor Tr1. That is, the bipolar transistor Q3 has the same structure as that of the transistor Q4 shown in FIG. 3.

The bipolar transistor Q3 is formed adjacent to the N-MOS transistor Tr1 which has a structure similar to that shown in FIG. 3. The collector electrode C of the transistor Q3 is connected to the drain electrode D of the transistor Tr1, the gate electrode G thereof is connected through the resistor Rs to the terminal 8a and the source electrode S thereof is connected to the source electrode S of the transistor Tr1. The structure of the bipolar transistor Q3 is the same as that of the N-MOS transistor Tr2 shown in FIG. 3.

As shown in FIG. 1, the potential of the drain electrodes D of the transistors Tr1 and Tr2, which are connected to the collector electrodes of the respective bipolar transistors Q3 and Q4 is the ground potential (reference potential) or higher and that of the source electrodes are lower than the ground potential. This is because the substrate 11 is set to the reference potential, that is, the ground potential and the junction portion between the diffusion isolating region 14 and the N type buried layer 12 must be reverse-biased.

As a result, the bipolar transistors Q3, Q4 and Q7 formed on the substrate 11 are operated by a potential not lower than the reference potential and the N-MOS transistors Tr1 to Tr6 are operated by a potential lower than the reference potential, while at least one of the electrodes of the N-MOS transistors being set to a potential lower than the reference potential.

The present invention has been described with reference to the embodiment shown in FIG. 1 which is driven by both the positive and negative power sources. In a case where the semiconductor amplifier circuit is driven by one of the positive and negative power sources, the ground potential becomes +Vcc/2 or −Vcc/2, so that the substrate 11 is set to this value as the reference potential. Since, in such case, it is possible to make the reference potential one half with respect to the power source, the same effect as that obtained by the amplifier circuit driven by the two power sources can be obtained.

As described hereinbefore, according to the present invention, transistors are formed in a region, which becomes in a floating state with respect to a semiconductor substrate, and the transistors are not limited to N-MOS transistors.

Further, although the substrate has been described as P type, an N type substrate may be used. In such case, the pnp transistors shown in FIG. 1 are changed to npn transistors, the npn transistors in FIG. 1 are changed to pnp transistors and the N-MOS transistors in FIG. 1 are changed to P-MOS transistors. A potential of a region surrounding an N well region is set a value equal to the N type substrate potential or lower and lower than that of the N well region, so that a junction between at least the surrounding region and the N well region is reverse-biased. Further, in FIGS. 2 and 3, the N type regions are changed to P type and the P type regions are changed to N type.

What is claimed is:

1. A semiconductor amplifier circuit comprising:
   a semiconductor substrate of one conductivity type;
   a well region of the one conductivity type, formed in said semiconductor substrate;
   a well region defining region of the other conductivity type, including a side wall portion and a bottom portion defining said well region;
   a first transistor formed in said well region; and
   a second transistor formed on a surface of another portion of said substrate other than a portion on which said well region is formed, wherein, during said first and second transistors are in operation, a potential of said substrate is set to a reference potential, a potential of said well region defining region is set equal to the potential of said substrate or set to a value at which a junction between said well region defining region and said substrate is reverse-biased and at least one of electrodes of said first transistor is set to a potential at which a junction between said well region defining region and said well region is reverse-biased and electrode potentials of said first and second transistors are set such that one of said first and second transistors operates with a potential not lower than the reference potential, at least one of electrodes of the other of said first and second transistors is set to a potential lower than the reference potential such that the other transistor operates with a potential lower than the reference potential.

2. A semiconductor amplifier circuit as claimed in claim 1, wherein said reference potential is substantially a half of a power source voltage.

3. A semiconductor amplifier circuit as claimed in claim 2, wherein said power source voltage is a sum of a positive power source voltage and a negative power source voltage and the reference potential is a ground potential.

4. A semiconductor amplifier circuit as claimed in claim 3, wherein a breakdown voltage of said first transistor is not lower than the power source voltage.

5. A semiconductor amplifier circuit as claimed in claim 4, wherein said substrate is a P type substrate, said first transistor is a MOS transistor, said second transistor is a bipolar transistor and said well region defining region is connected to said positive power source voltage.

6. A semiconductor amplifier circuit as claimed in claim 4, wherein said substrate is a P type substrate, said first transistor is a MOS transistor, said second transistor is a bipolar transistor and said well region defining region is connected to a ground potential.

7. A semiconductor amplifier circuit as claimed in claim 5, wherein said positive and negative power source voltages are within a range from 3V to 5V and said well region is formed as an epitaxial layer having a thickness in a range from several microns to 10 microns and a sheet resistance in a range from 2 kΩ to 5 kΩ.

* * * * *